(12) United States Patent
Romano et al.

(10) Patent No.: US 9,159,784 B2
(45) Date of Patent: Oct. 13, 2015

(54) ALUMINUM GALLIUM NITRIDE ETCH STOP LAYER FOR GALLIUM NITRIDE BASED DEVICES

(75) Inventors: Linda Romano, Sunnyvale, CA (US); Andrew P. Edwards, San Jose, CA (US); Richard J. Brown, Los Gatos, CA (US); David P. Bour, Cupertino, CA (US); Hui Nie, Cupertino, CA (US); Isik C. Kizilyalli, San Francisco, CA (US); Thomas R. Prunty, Santa Clara, CA (US); Mahdan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 187 days.

(21) Appl. No.: 13/299,227

(22) Filed: Nov. 17, 2011

(65) Prior Publication Data

US 2013/0126884 A1 May 23, 2013

(51) Int. Cl.
| | |
|---|---|
| *H01L 29/872* | (2006.01) |
| *H01L 29/06* | (2006.01) |
| *H01L 29/66* | (2006.01) |
| *H01L 29/778* | (2006.01) |
| *H01L 21/306* | (2006.01) |
| *H01L 29/47* | (2006.01) |
| *H01L 29/20* | (2006.01) |
| *H01L 29/10* | (2006.01) |

(52) U.S. Cl.
CPC ...... *H01L 29/0615* (2013.01); *H01L 21/30621* (2013.01); *H01L 29/66212* (2013.01); *H01L 29/66462* (2013.01); *H01L 29/7786* (2013.01); *H01L 29/872* (2013.01); *H01L 29/0619* (2013.01); *H01L 29/0657* (2013.01); *H01L 29/1066* (2013.01); *H01L 29/2003* (2013.01); *H01L 29/475* (2013.01)

(58) Field of Classification Search
USPC .......... 257/471, 475, 483, 484, 485, E51.009, 257/E33.051
See application file for complete search history.

(56) References Cited

U.S. PATENT DOCUMENTS

| | | | |
|---|---|---|---|
| 2004/0124435 A1* | 7/2004 | D'Evelyn et al. | 257/103 |
| 2007/0096239 A1 | 5/2007 | Cao et al. | |
| 2010/0330754 A1* | 12/2010 | Hebert | 438/172 |
| 2013/0087835 A1* | 4/2013 | Edwards et al. | 257/263 |

OTHER PUBLICATIONS

Zauner et al., "Homoepitaxial Growth on Misoriented GaN Substrates by MOCVD," Proceedings of the Material Research Society Symposium W (Dec. 1999).*
U.S. Appl. No. 13/932,290, filed Jul. 2, 2013, by Romano et al. (Unpublished.).

* cited by examiner

*Primary Examiner* — Thomas L Dickey
(74) *Attorney, Agent, or Firm* — Kilpatrick Townsend and Stockton LLP

(57) ABSTRACT

A semiconductor structure includes a III-nitride substrate with a first side and a second side opposing the first side. The III-nitride substrate is characterized by a first conductivity type and a first dopant concentration. The semiconductor structure also includes a III-nitride epitaxial layer of the first conductivity type coupled to the first surface of the III-nitride substrate, and a first metallic structure electrically coupled to the second surface of the III-nitride substrate. The semiconductor structure further includes an AlGaN epitaxial layer coupled to the III-nitride epitaxial layer of the first conductivity type, and a III-nitride epitaxial structure of a second conductivity type coupled to the AlGaN epitaxial layer. The III-nitride epitaxial structure comprises at least one edge termination structure.

11 Claims, 8 Drawing Sheets

ALUMINUM GALLIUM NITRIDE ETCH STOP LAYER FOR GALLIUM NITRIDE BASED DEVICES

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for using aluminum gallium nitride layers as etch stop layers in gallium-nitride based devices. Merely by way of example, the invention has been applied to the fabrication of edge termination structures for an electronic device and the fabrication of an enhancement mode HEMT. The methods and techniques can be applied to a variety of compound semiconductor systems including diodes and transistors.

As described more fully throughout the present specification, an AlGaN layer grown between two GaN layers is suitable for use as an etch stop in GaN devices. The etch stop is used to determine trench depth through control of the etch depth. Control of the trench depth enables a reproducible manufacturing process for making devices with consistent electrical characteristics. According to some of the embodiments described herein, the AlGaN layer is thin (e.g., <10 nm) in comparison the thickness of the GaN layers, thereby minimizing any effect on the device operation. The AlGaN layer can be doped or undoped depending on the particular application. Accordingly, the thickness and doping concentration associated with the AlGaN etch stop layer are selected to provide an etch stop layer that results in minimal interference with (i.e., little to no role in) the device functionality or operation.

According to an embodiment of the present invention, a semiconductor structure is provided. The semiconductor structure includes a III-nitride substrate with a first side and a second side opposing the first side. The III-nitride substrate is characterized by a first conductivity type and a first dopant concentration. The semiconductor structure also includes a III-nitride epitaxial layer of the first conductivity type coupled to the first surface of the III-nitride substrate, and a first metallic structure electrically coupled to the second surface of the III-nitride substrate. The semiconductor structure further includes an AlGaN epitaxial layer coupled to the III-nitride epitaxial layer of the first conductivity type, and a III-nitride epitaxial structure of a second conductivity type coupled to the AlGaN epitaxial layer. The III-nitride epitaxial structure comprises at least one edge termination structure.

According to another embodiment of the present invention, a method of fabricating edge termination structures in gallium nitride (GaN) materials is provided. The method includes providing a n-type GaN substrate having a first surface and a second surface, forming an n-type GaN epitaxial layer coupled to the first surface of the n-type GaN substrate, and forming a first metallic structure electrically coupled to the second surface of the n-type GaN substrate. The method further includes forming an AlGaN epitaxial layer coupled to the n-type GaN epitaxial layer, and forming a p-type GaN epitaxial layer coupled to the AlGaN epitaxial layer. Finally, the method includes removing at least a portion of the p-type GaN epitaxial layer to form an exposed portion of the AlGaN epitaxial layer and form at least one edge termination structure.

According to a specific embodiment of the present invention, a III-nitride HEMT is provided. The III-nitride HEMT includes a substrate comprising a first n-type III-nitride material, and a drift region comprising a second n-type III-nitride material coupled to the substrate and disposed adjacent to the substrate along a vertical direction. The III-nitride HEMT also includes an AlGaN barrier layer coupled to the drift region, a p-type III-nitride epitaxial layer coupled to the AlGaN barrier layer, a Schottky contact coupled to the p-type III-nitride epitaxial layer, and a plurality of electrical contacts coupled to the AlGaN drift region.

According to yet another embodiment of the present invention, a method of processing III-nitride materials is provided. The method includes providing a III-nitride epitaxial structure including a III-nitride substrate, an AlGaN etch stop layer coupled to the III-nitride substrate, and a III-nitride epitaxial layer coupled to the AlGaN etch stop layer. The method further includes forming a masking layer on predetermined portions of the III-nitride epitaxial structure to form exposed regions, exposing the exposed regions of the III-nitride epitaxial structure to an etchant, and exposing the III-nitride epitaxial structure to electromagnetic radiation. The method additionally includes absorbing a portion of the electromagnetic radiation in the III-nitride epitaxial layer, etching at least a portion of the III-nitride epitaxial layer, and terminating the etching in the AlGaN etch stop layer.

Numerous benefits are achieved by way of the present invention over conventional techniques. For example, embodiments of the present invention provide methods and systems for fabricated GaN-based devices incorporating an AlGaN etch stop layer(s) that increase manufacturing yield and reduce device cost. Embodiments of the present invention are applicable to a wide variety of devices including, without limitation, Schottky diodes with p-GaN guard rings for edge termination, enhancement mode HEMTs, and the like. These and other embodiments of the invention along with many of its advantages and features are described in more detail in conjunction with the text below and attached figures.

DETAILED DESCRIPTION OF SPECIFIC EMBODIMENTS

Embodiments of the present invention relate to electronic devices. More specifically, the present invention relates to methods and systems for using aluminum gallium nitride layers as etch stop layers in gallium-nitride based devices. Merely by way of example, the invention has been applied to the fabrication of edge termination structures for an electronic device and the fabrication of an enhancement mode HEMT. The methods and techniques can be applied to a variety of compound semiconductor systems including diodes and transistors.

Inductively coupled plasma etching processes utilizing gases such as $Cl_2$ and $BCl_3$ have been used to etch both GaN and AlGaN alloys. The addition of $SF_6$ to the etchant gas mixture creates a layer of AlF on the AlGaN surface, which limits the etch rate of AlGaN layers relative to the GaN layers. The formation characteristics of the AlF layer are dependent on the aluminum concentration (i.e., mole fraction). Higher pressures, lower dc biases, and higher $SF_6/BCl_3$ ratios increase the GaN to AlGaN selectivity. The etch rate can be determined by managing both the aluminum mole fraction and $SF_6$ concentration.

Figure 6:
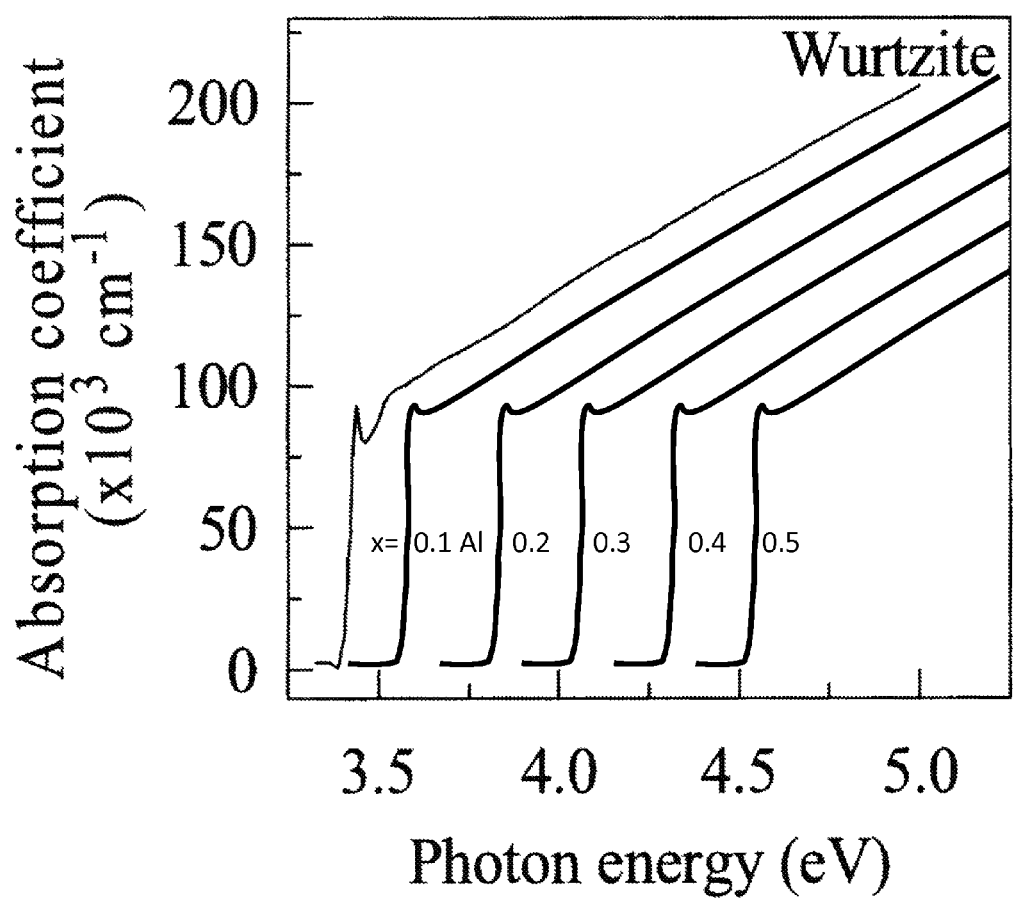
FIG. 6 is a simplified graph of illustrating absorption coefficients for AlGaN with different concentrations of Al (up to 50%).

Photo-enhanced chemical etching is an alternative method of selectively etching AlGaN/GaN by altering the wavelength of incident light during etching. Smooth n-GaN surfaces can be obtained at etch rates as high as 50 nm/min using a KOH solution and a mercury arc lamp illumination filtered at 365 nm. The absorption of light by the GaN results in the creation of hole electron pairs, which contribute carriers used in the etching process. In contrast with GaN, the absorption edge for AlN is near 200 nm, resulting in negligible absorption at wavelengths between 200 nm and 365 nm. FIG. 6 shows the absorption coefficients for AlGaN having different Al composition—up to 50% Al. Below the band edge, the absorption at all compositions is negligible <200 cm-1. Above the band edge, the absorption coefficient is >80,000 cm-1 depending on the Al composition. FIG. 6 is based on findings provided in O. Ambacher, J. Appl. Phys, 31, 2653 (1998), which is hereby incorporated by reference. In some embodiments, an absorption coefficient of the AlGaN etch stop layer at wavelengths associated with electromagnetic radiation used during an etching process is less than 1,000 $cm^{-1}$.

Therefore, by selecting a wavelength of illumination light less than 365 nm, the etching of GaN proceeds, but since the AlGaN is transparent to the illumination light, the etching process stops when the AlGaN surface is reached, thereby resulting in an AlGaN etch stop layer. The wavelength of light used during the photo-enhanced chemical etching process can be varied depending on the aluminum composition of the structure.

According to embodiments of the present invention, an advantage of using AlGaN as an etch stop layer in devices that include trenches is that the depth of the trench can be made to be dependent on the thickness of the GaN layer. The growth rate on a planar surface can be better controlled than an etch rate on a disrupted, trench surface. Controlling trench depths is only one aspect of controlling a manufacturing process. Varying trench depths in devices that require p-guard rings, for example, will affect the potential distribution in the guard ring region. In addition, for many devices, it is desirable to have an etched surface that is planar for the subsequent deposition of a dielectric insulating layer like $Si_3N_4$, for example. The planarity of the AlGaN layer provided herein creates such a suitable surface for the deposition of $Si_3N_4$, other dielectrics, or other appropriate layers.

The thickness of the AlGaN etch stop layer is a predetermined thickness depending on the particular application and device design. According to embodiments of the present invention, the thickness of the AlGaN etch stop layer is sufficient to create a barrier to the GaN layer during etching. In addition, in devices, for example, that utilize vertical current flow through the epitaxial structure, the AlGaN etch stop layer should preferably have an electrical resistivity that does not substantially interfere with device performance. According to embodiments of the present invention, the thickness of the AlGaN layer ranges from about 3 nm, which is thick enough to provide complete coverage of the underlying GaN layer, to greater thicknesses. According to embodiments of the present invention, the AlGaN layer thickness can range from about 1 nm to about 30 nm, for example, 10 nm. Other thicknesses can be utilized depending on the particular application and the thickness values discussed herein are not intended to limit embodiments of the present invention. The AlGaN etch stop layer can be doped to form a p-type layer, an n-type layer, or can be undoped depending on the device application. As will be evident to one of skill in the art, the thickness of the AlGaN layer can be a function of the etch selectivity between GaN and AlGaN, with thinner etch stop layers utilized as the etch selectivity increases.

Figure 1A:
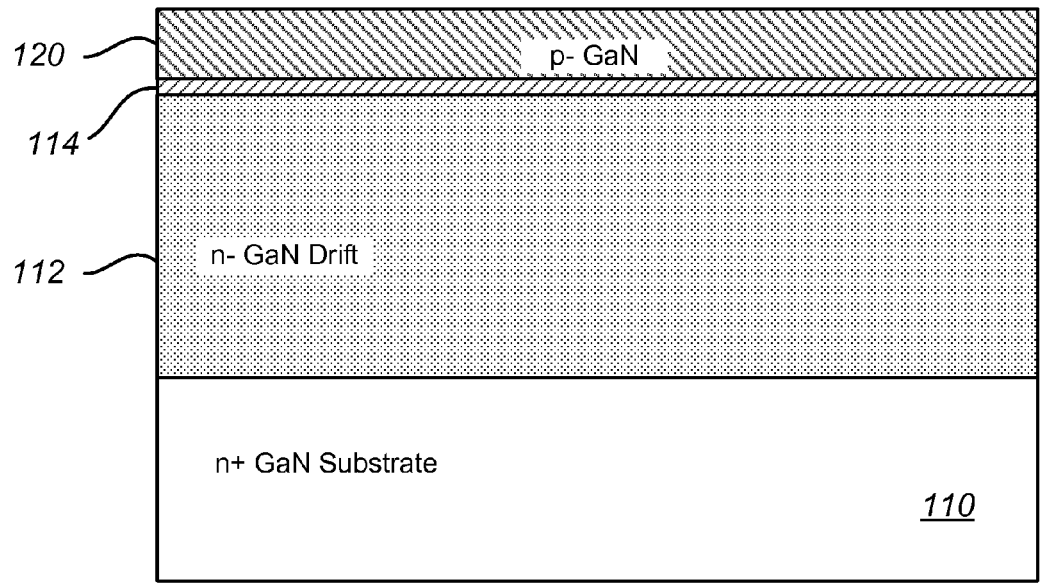
FIGS. 1A-1C are simplified schematic diagrams illustrating a process flow for fabricating an electronic device including an edge termination structure using an AlGaN etch stop layer according to an embodiment of the present invention.
Figure 1B:
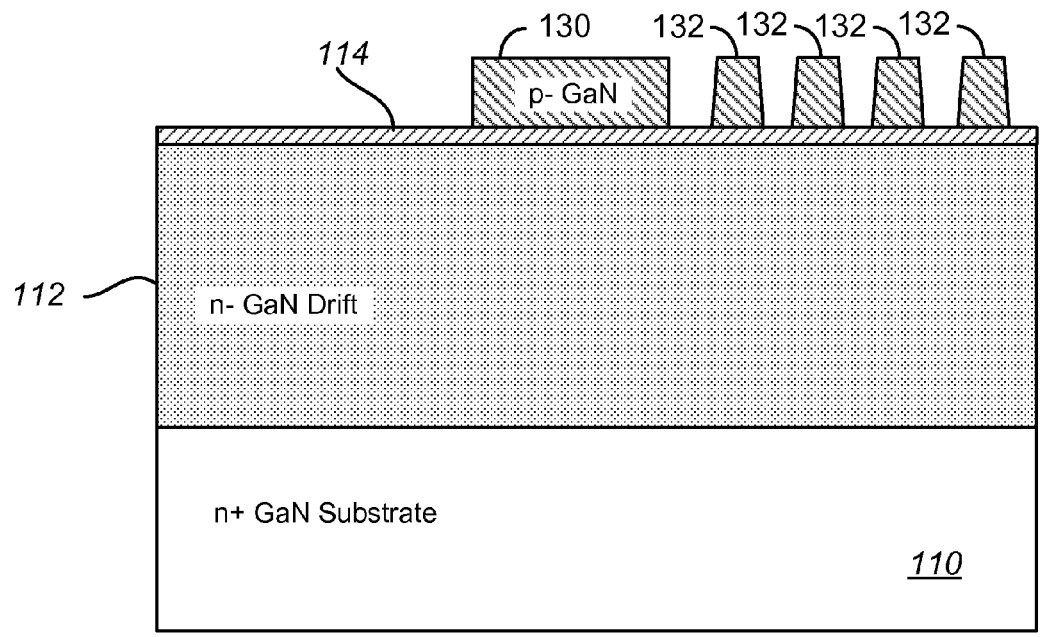
Figure 1C:
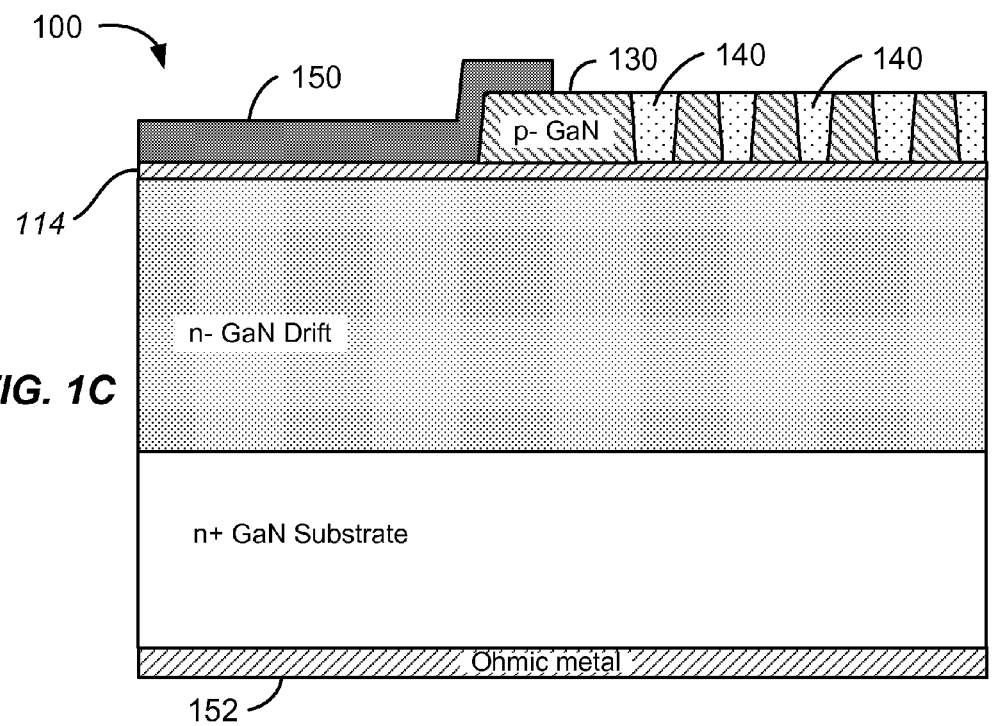

Embodiments of the present invention provide a process for creating a Schottky barrier diode in GaN with edge termination structures (e.g., a floating guard ring) formed through the etching of an epitaxial layer. FIGS. 1A-1C are simplified schematic diagrams illustrating a process flow for fabricating an electronic device including an edge termination structure using an AlGaN etch stop layer according to an embodiment of the present invention. Referring to FIG. 1A, a first GaN epitaxial layer 112 is formed on a GaN substrate 110 having the same conductivity type. The GaN substrate 110 can be a pseudo-bulk GaN material on which the first GaN epitaxial layer 112 is grown. Dopant concentrations (e.g., doping density) of the GaN substrate 110 can vary, depending on desired functionality. For example, a GaN substrate 100 can have an n+ conductivity type, with dopant concentrations ranging from $1 \times 10^{17}$ $cm^{-3}$ to $1 \times 10^{20}$ $cm^{-3}$. Although the GaN substrate 110 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 112 can also vary, depending on desired functionality. The first GaN epitaxial layer 112 can serve as a drift region for the Schottky diode, and therefore can be a relatively low-doped material. For example, the first GaN epitaxial layer 112 can have an n− conductivity type, with dopant concentrations ranging from $1 \times 10^{14}$ cm to $1 \times 10^{18}$ $cm^{-3}$. Furthermore, the dopant concentration can be uniform, or can vary, for example, as a function of the thickness of the drift region.

The thickness of the first GaN epitaxial layer 112 can also vary substantially, depending on the desired functionality. As discussed above, homoepitaxial growth can enable the first GaN epitaxial layer 112 to be grown far thicker than layers formed using conventional methods. In general, in some embodiments, thicknesses can vary between 0.5 μm and 100 μm, for example. In other embodiments thicknesses are greater than 5 μm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Referring to FIG. 1A, an n-type GaN substrate is utilized, but the present invention is not limited to this particular material. In other embodiments, substrates with p-type doping are utilized. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention. Additionally, embodiments can use materials having an opposite conductivity type to provide devices with different functionality. For example, embodiments provided herein utilize a heavily doped n-type substrate and p-type edge termination structures. However, a device with n-type edge termination structures can be formed by using materials with opposite conductivity (e.g., substituting p-type materials for n-type materials, and vice versa) in a similar manner as will be evident to one of skill in the art.

Although some embodiments are discussed in terms of n-type GaN substrates and GaN epitaxial layers, the present invention is not limited to these particular materials. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

An AlGaN etch stop layer 114 is coupled to epitaxial layer 112. According to embodiments of the present invention, the AlGaN etch stop layer has an aluminum mole fraction ranging from about 0.01 to about 0.5 (i.e., $Al_{0.01}Ga_{0.99}N$ to $Al_{0.5}Ga_{0.5}N$). The thickness of the AlGaN etch stop layer can range from about 1 nm to about 30 nm, for example 10 nm, which provides for a pinhole free layer while reducing the impact of the etch stop layer on device performance. In some embodiments, the AlGaN epitaxial layer is doped, for example, characterized by a dopant concentration greater than $1\times10^{17}$ $cm^{-3}$. In other embodiments, the AlGaN etch stop layer is undoped or doped at other concentrations.

Referring again to FIG. 1A, an epitaxial layer 120 is coupled to AlGaN etch stop layer 114. In the illustrated embodiment, epitaxial layer 120 is a heavily doped p-type layer suitable for use in forming edge termination structures as well as other electronic uses. The epitaxial layer 120, from which edge termination structures are eventually formed, can have a conductivity type different than the first GaN epitaxial layer 112. For instance, if the first GaN epitaxial layer 112 is formed from an n-type GaN material, the epitaxial layer 120 will be formed from a p-type GaN material, and vice versa. In some embodiments, the epitaxial layer 120 used to form the edge termination structures is a continuous regrowth over portions of the first GaN epitaxial layer 112 with other portions of the structure, such as regions of other semiconductor devices, characterized by reduced or no growth as a result of the presence of a regrowth mask (not shown). One of ordinary skill in the art would recognize many variations, modifications, and alternatives.

The thickness of the epitaxial layer 120 can vary, depending on the process used to form the layer and the device design. In some embodiments, the thickness of the epitaxial layer 120 is between 0.1 μm and 5 μm. In other embodiments, the thickness of the epitaxial layer 120 is between 0.3 μm and 1 μm.

The epitaxial layer 120 can be lightly doped in other embodiments, for example in a range from about $5\times10^{17}$ $cm^{-3}$ to about $1\times10^{19}$ $cm^{-3}$. Additionally, as with other epitaxial layers, the dopant concentration of the epitaxial layer 120 can be uniform or non-uniform as a function of thickness. In some embodiments, the dopant concentration increases with thickness, such that the dopant concentration is relatively low near the AlGaN etch stop layer 114 and increases as the distance from the AlGaN etch stop layer 114 increases. Such embodiments provide higher dopant concentrations at the top of the epitaxial layer 120 where metal contacts can be subsequently formed. Other embodiments utilize additional heavily doped contact layers (not shown) to form ohmic contacts.

FIG. 1B is a simplified cross-sectional diagram illustrating the removal at least a portion of the epitaxial layer 120 to form edge termination structures 130/132. As discussed in further detail below, edge termination structures 130/132 can include any of a variety of structures, such as guard rings that circumscribe the Schottky diode to provide edge termination. Additional discussion related to edge termination structures is provided in U.S. patent application Ser. No. 13/270,606, the disclosure of which is hereby incorporated by reference in its entirety for all purposes.

Additionally, as illustrated in FIG. 1B, the removal (e.g., etch) process is terminated by the AlGaN etch stop layer 114. The presence of the etch stop layer provides benefits not available using conventional techniques, thereby reducing the control needed over the removal process. Inductively-coupled plasma (ICP) etching and/or other GaN etching processes including etching using a $BCl_3$ or $Cl_2$, and $SF_6$ plasma can be used that are selective for the AlGaN etch stop layer. Additionally, a photo-enhanced chemical etching process can be utilized as described above.

FIG. 1C illustrates the deposition of an insulating layer 140, for example, $Si_3N_4$, in the guard ring region, which provides for electrical insulation between the elements of the edge termination structures 130/132. A deposition and planarization process can be used to form insulating layer 140.

A Schottky metal structure 150 is formed on the AlGaN etch stop layer 114. The Schottky metal structure 150 can be one or more layers of metal and/or alloys to create a Schottky barrier with the AlGaN etch stop layer 114 and/or other epitaxial layers such as the first GaN epitaxial layer 112.

As illustrated in FIG. 1C, the Schottky metal structure 150 of the electronic device 100 can overlap portions of the nearest edge termination structure 130. The Schottky metal structure 150 can be formed using a variety of techniques, including lift-off and/or deposition with subsequent etching, which can vary depending on the metals used. Examples of Schottky metals include nickel, palladium, platinum, combinations thereof, of the like.

FIG. 1C also illustrates the formation of an ohmic metal structure 152 coupled to the GaN substrate 110. The ohmic metal structure 152 can be one or more layers of metal that serve as a contact for the cathode of the Schottky diode. For example, the ohmic metal structure 152 can comprise a titanium-aluminum (Ti/Al) ohmic metal. Other metals and/or alloys can be used including, but not limited to, aluminum, nickel, gold, combinations thereof, or the like. In some embodiments, an outermost metal of the ohmic metal structure 152 can include gold, tantalum, tungsten, palladium, silver, or aluminum, combinations thereof, and the like. The ohmic metal structure 152 can be formed using any of a variety of methods such as sputtering, evaporation, or the like.

Although the AlGaN etch stop layer is very thin in some embodiments in order to reduce or minimize impacts on device functionality, an additional etching process can be utilized in some embodiments to remove the AlGaN etch stop layer in regions not covered by the unetched portions of epitaxial layer 120. Thus, the AlGaN etch stop layer can be used as both an etch stop and a protective layer, terminating the etch process for epitaxial layer 120 and protecting the underlying epitaxial layer 112. Since the AlGaN etch stop layer can be thin, an etch that is highly controllable and reproducible can be used to remove exposed portions of the AlGaN etch stop layer, providing a clean surface of epitaxial layer 112.

Figure 1D:
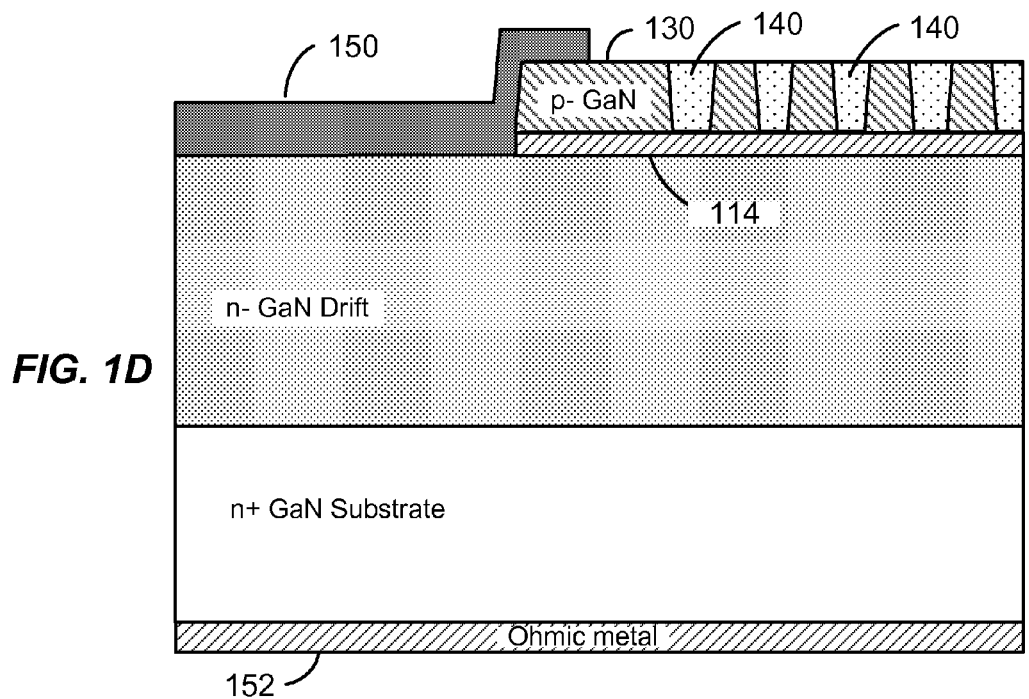
FIG. 1D illustrates a device structure with a partially removed AlGaN etch stop layer according to an embodiment of the present invention.

FIG. 1D illustrates an embodiment in which the AlGaN etch stop layer is removed in the region of the device where the Schottky metal structure 150 is formed. The AlGaN etch stop layer remains under the unetched portions of epitaxial layer 120 as well as under the insulating sections 140. In the embodiment illustrated in FIG. 1D, a high quality surface of the n-GaN drift layer is provided by the protection enabled by the use of the AlGaN etch stop layer.

In some embodiments, the presence of the AlGaN etch stop layer in regions adjacent to the active device region, i.e., the Schottky metal structure 150, can increase the breakdown voltage as a result of the higher aluminum mole fraction of the AlGaN material in comparison to the GaN material. Referring to FIG. 1C, the AlGaN etch stop layer 114 positioned under the p-GaN epitaxial layer 120 can enhance the breakdown voltage of the device in comparison with conventional designs.

Depending on the particular device implementation, the conductivity of the AlGaN etch stop layer can be modified as appropriate. The etch selectivity as a function of doping and the thickness of the AlGaN etch stop layer can be related and can, therefore, impact the device design. Tradeoffs between doping levels, the conductivity of the AlGaN etch stop layer, the thickness of the AlGaN etch stop layer, the aluminum mole fraction, and the like can be performed as part of the device design. One of ordinary skill in the art would recognize many variations, modifications, and alternatives.

FIGS. 2A-2D are simplified schematic diagrams illustrating a process flow illustrating fabrication of a p-GaN enhancement mode high electron mobility transistor (HEMT) including an AlGaN etch stop layer. In the device illustrated in FIG. 2D, a horizontal (i.e., lateral) p-gated HEMT is provided. The process flow illustrated in FIGS. 2A-2D shares some similarities with the process flow illustrated in FIGS. 1A-1C, and, therefore, some redundant description is omitted for purposes of brevity.

Figure 2A:
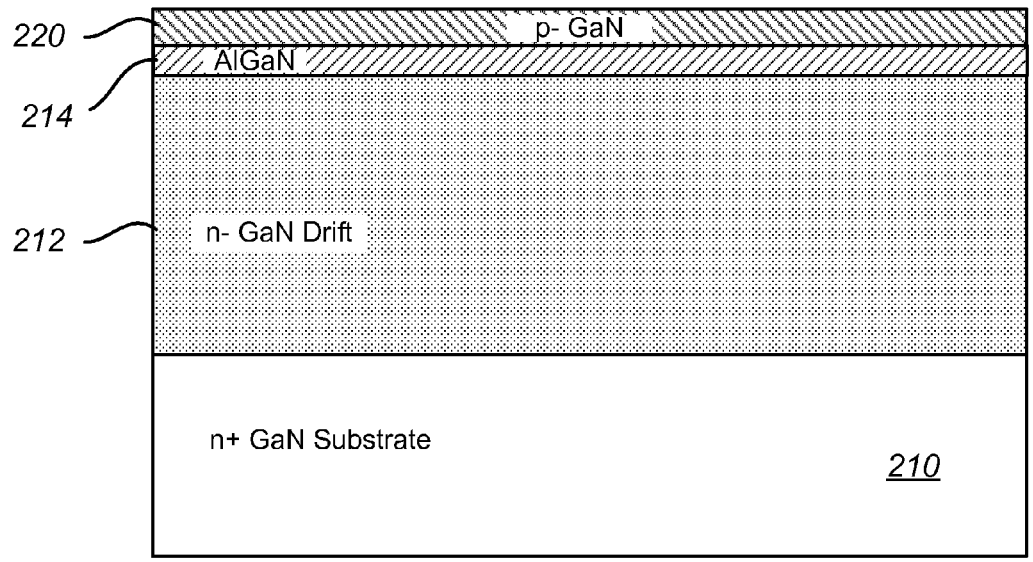
FIGS. 2A-2D are simplified schematic diagrams illustrating a process flow illustrating fabrication of a p-GaN enhancement mode high electron mobility transistor (HEMT) including an AlGaN etch stop layer.

Referring to FIG. 2A, a substrate 210, an epitaxial layer 212, which will provide a drift region of n-type GaN material for the device, and an AlGaN barrier layer 214 are illustrated. The AlGaN barrier layer also serves as an etch stop layer as described below. The AlGaN barrier layer 214 is coupled to epitaxial layer 212 which isolates the lateral HEMT from the substrate 210. As discussed in relation to FIG. 1A, the various epitaxial layers illustrated in FIG. 2A are provided as examples and are not intended to limit embodiments of the present invention to the particular exemplary materials.

Figure 2B:
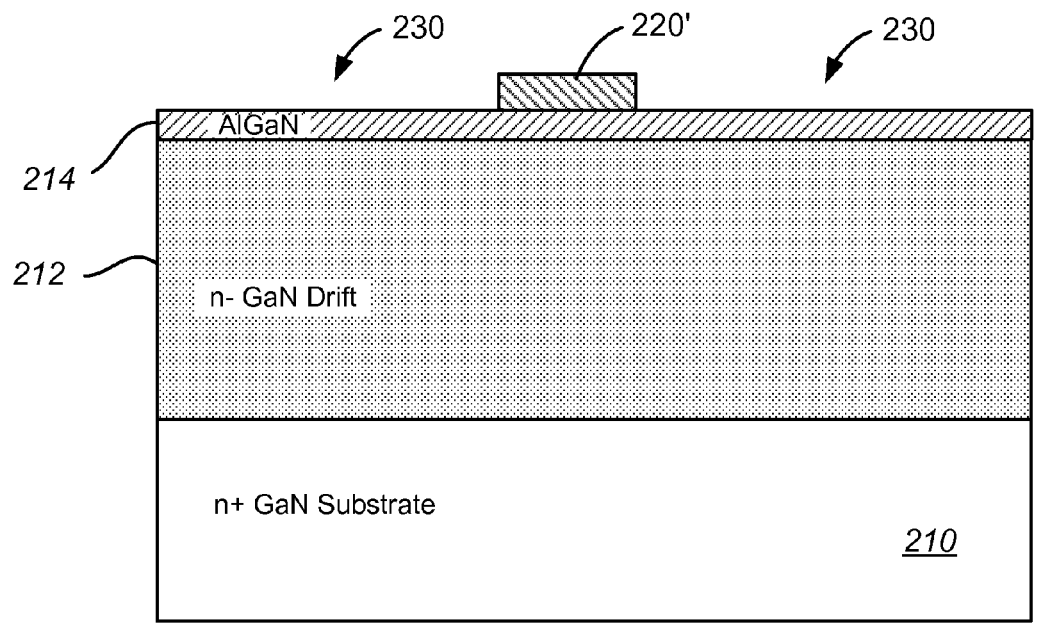

A p+ GaN epitaxial layer 220 is grown on the epitaxial stack as illustrated in FIG. 2A in order to provide a p-type material for the p-n junction gated HEMT described below. In embodiments in which a p-type substrate is utilized, epitaxial layer 220 can be an n-type layer as appropriate to the underlying epitaxial structure. Referring to FIG. 2B, portions 230 of epitaxial layer 220 are removed (e.g., using a photolithographic patterning/masking and a $BCl_3$ or $Cl_2$ and $SF_6$ plasma etching process) to form the gate region 220'. The presence of the AlGaN etch stop layer enables the use of an etching process such as a $BCl_3$ or $Cl_2$ and $SF_6$ plasma etching process or a photo-enhanced chemical etching process to pattern the gate region 220'. A blanket deposition of an insulating material (not shown) (which may also have passivating properties) such as silicon nitride, silicon oxide, or the like, can be performed after removal of portions 230 of the epitaxial layer 220.

Figure 2C:
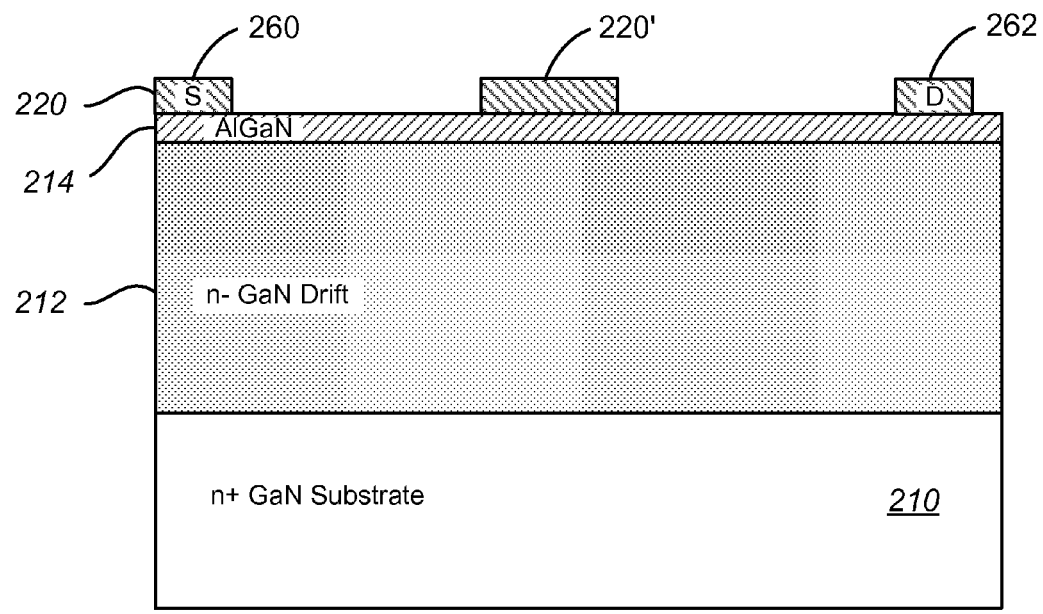

As illustrated in FIG. 2C, ohmic metals are deposited and patterned to provide for electrical contact to the source and drain of the HEMT. Referring to FIG. 2C, metals 260 is a source metal and metal 262 is a drain metal. Metals suitable for use as these contacts include TiAl and other metals that can provide ohmic contacts to AlGaN. The presence of the AlGaN etch stop layer 214 enables the use of an etching process such as a $BCl_3$ or $Cl_2$ and $SF_6$ plasma etching process to be used to pattern the source and drain metals. In other embodiments, a photo-enhanced chemical etching process is utilized. Electrical contacts 260 and 262 can be deposited and annealed prior to deposition of Schottky contacts, which are not typically capable of surviving the ohmic contact anneal temperatures. An anneal process for ohmic metals 260 and 262 can be performed, for example, at a temperature >800° C. for >3 minutes.

Figure 2D:
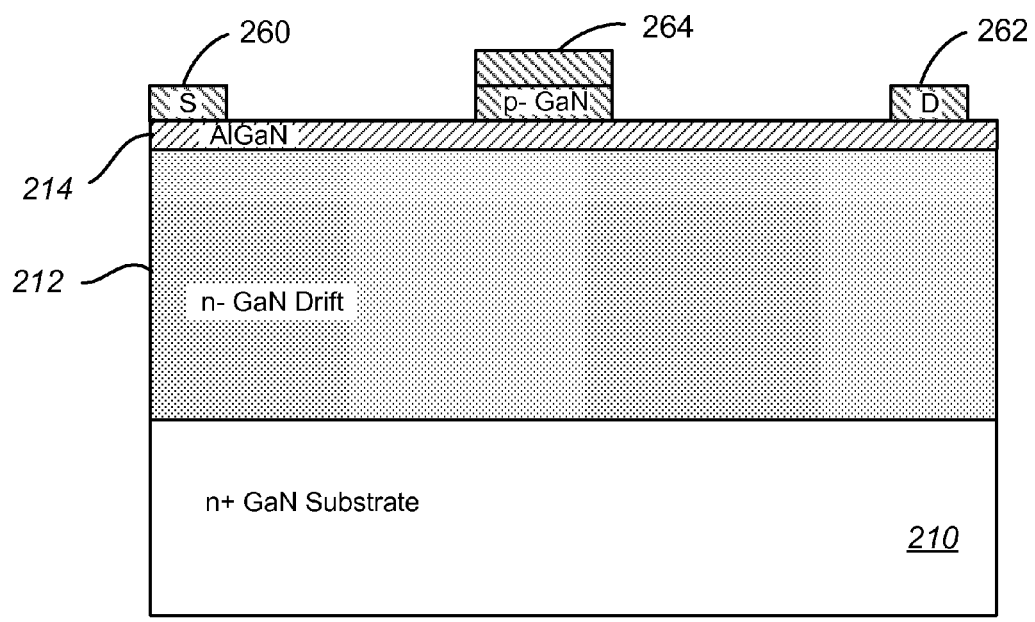

Referring to FIG. 2D, ohmic gate metal 264 is deposited and patterned to provide the gate contact for the HEMT. In some embodiments, the top surface of gate region 220' is treated to place it in a condition suitable for an ohmic contact to p-GaN and ohmic metal 264 is deposited and patterned using a suitable electrically conductive material. Examples of ohmic metals to p-GaN include nickel, palladium, platinum, combinations thereof, of the like. The geometry of the ohmic contact 264 will be a function of the device geometry for the horizontal HEMT.

As illustrated in FIG. 2D, the composition and the doping of the AlGaN etch stop layer can be selected to provide for both etch stop functionality during fabrication as well as to support the two dimensional electron gas during operation of the HEMT. As an example, the AlGaN layer can utilize a varying doping concentration, varying aluminum mole fraction, or the like to provide a layer that is suitable for etch stop purposes as well as providing the proper electrical performance for the HEMT. Thus, a layer with varying composition and/or doping concentration or a series of AlGaN layers with varying composition and/or doping concentration can be utilized in some embodiments of the present invention. As discussed previously, the thickness and the conductivity of the AlGaN etch stop layer(s) can be modified as appropriate to the particular device design.

Although the HEMT shown in FIG. 2D includes the illustrated layers, other layers, including additional layers, can be utilized as appropriate to the particular device design. Additional description related to GaN-based HEMTs is provided in commonly assigned U.S. patent application Ser. No. 13/267,552, filed on Oct. 6, 2011, the disclosure of which is hereby incorporated by reference in its entirety. Epitaxial layers illustrated in this commonly assigned application can be utilized in the structures described herein to provide desired electrical functionality. One of ordinary skill in the art would recognize many variations, modifications, and alternatives.

Figure 3:
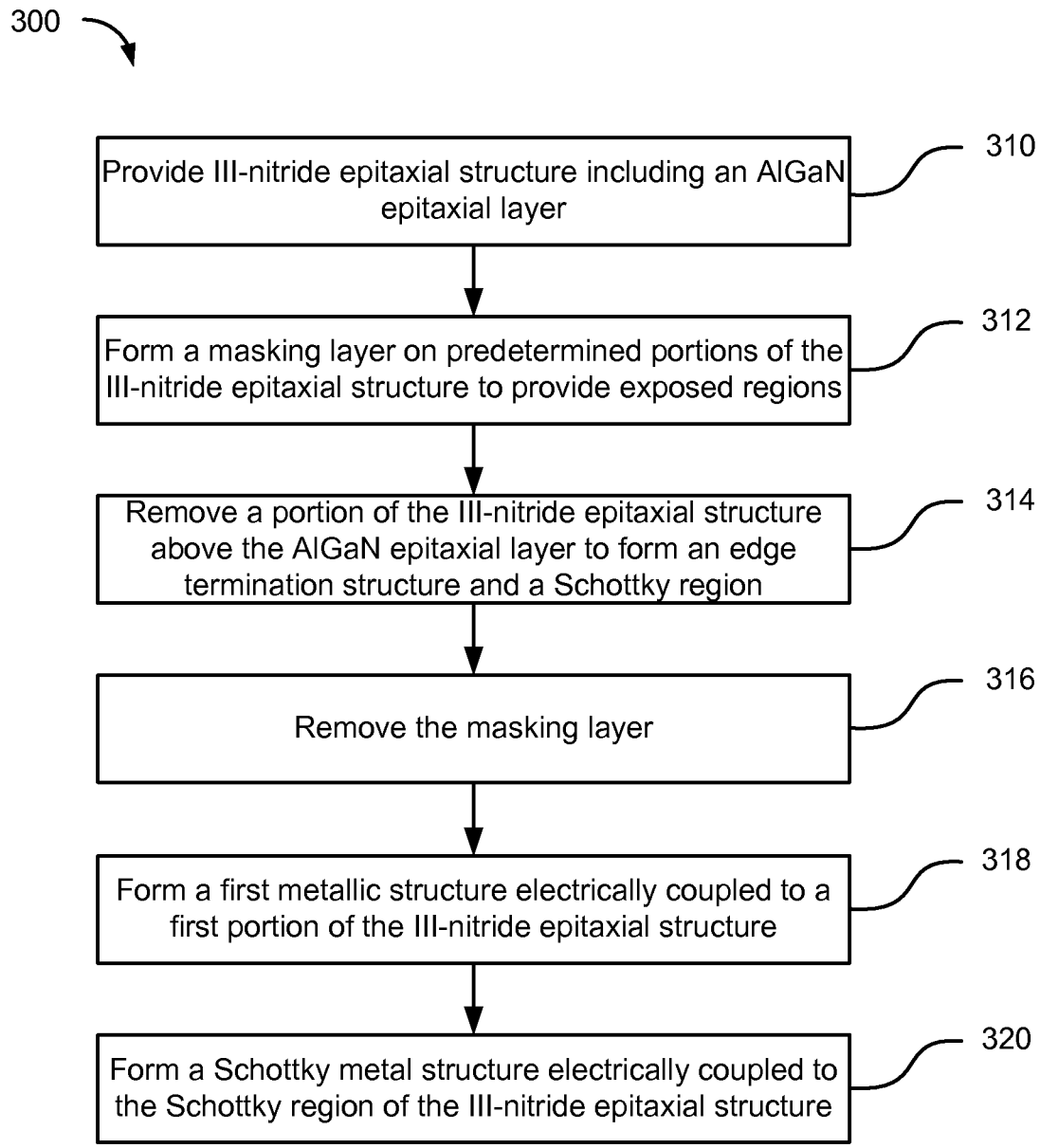
FIG. 3 is a simplified flowchart illustrating a method of fabricating edge termination structures in gallium nitride (GaN) materials according to an embodiment of the present invention.

FIG. 3 is a simplified flowchart illustrating a method of fabricating edge termination structures in gallium nitride (GaN) materials according to an embodiment of the present invention. The method 300 includes providing a III-nitride epitaxial structure (e.g., including an n-type GaN substrate) including an AlGaN epitaxial layer (310). The epitaxial structure illustrated in FIG. 1A includes an n-type III-nitride material substrate, a drift region including a second n-type III-nitride material coupled to the substrate and disposed adjacent to the substrate along a vertical direction, and a p-type III-nitride epitaxial layer coupled to the AlGaN epitaxial layer. As described throughout the present specification, the AlGaN epitaxial layer can provide etch stop and passivation functionality. The method also includes forming a masking layer on predetermined portions of the III-nitride epitaxial structure to provide exposed regions (312). The method further includes removing a portion of the III-nitride epitaxial structure above the AlGaN epitaxial layer to form an edge termination structure and a Schottky region (314). The masking layer is then removed (316). In some embodiments, the edge termination structure includes multiple edge termination elements.

The method also includes forming a first metallic structure electrically coupled to a first portion of the III-nitride epitaxial structure (318) and forming a Schottky metal structure electrically coupled to the Schottky region of the III-nitride epitaxial structure (320). The Schottky metal structure can be electrically coupled to the at least one of the edge termination structure elements. In an embodiment the method can additionally include forming a metallic field plate (represented by the portion of Schottky contact 150 overhanging a portion of edge termination structure 130) coupled to the at least one edge termination structure, which can circumscribe a device structure.

It should be appreciated that the specific steps illustrated in FIG. 3 provide a particular method of fabricating edge termination structures in gallium nitride (GaN) materials according to an embodiment of the present invention. Other devices can also be fabricated using the methods described in relation to FIG. 3 as well as throughout the present specification. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4:
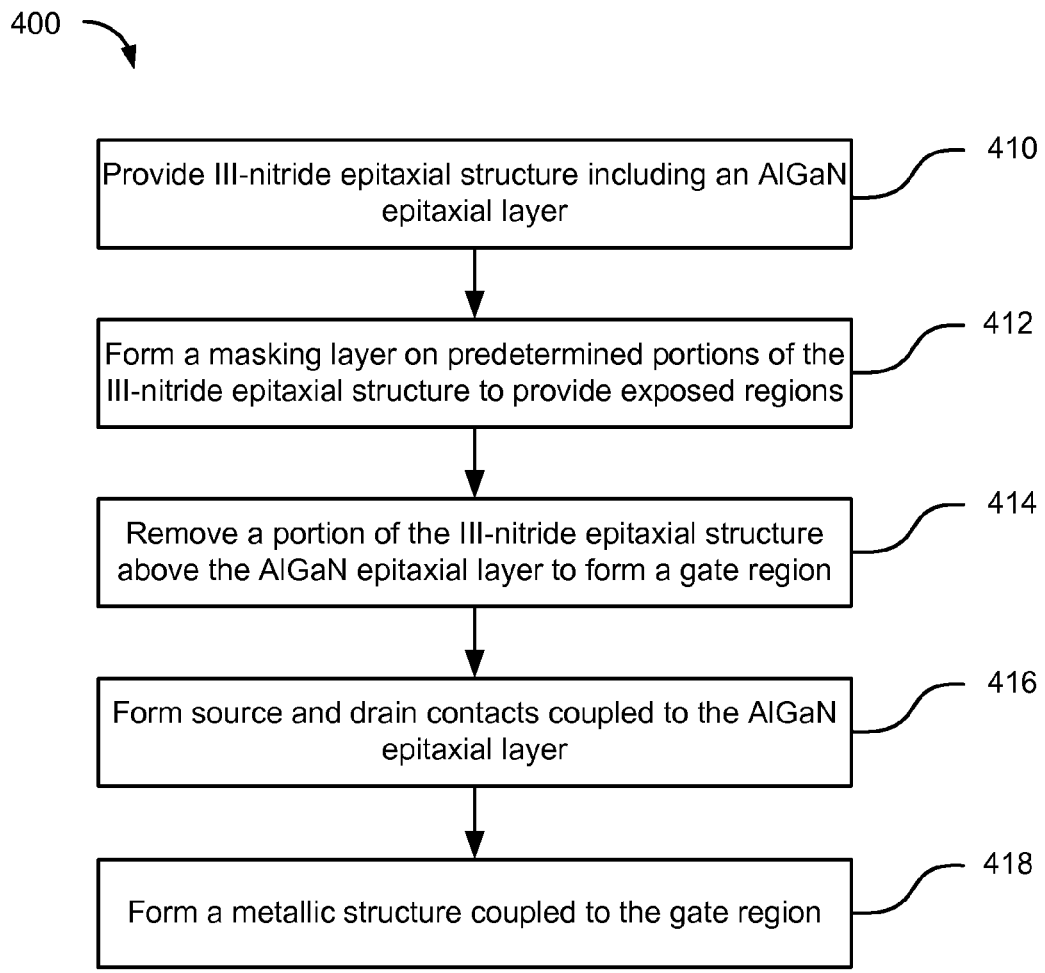
FIG. 4 is a simplified flowchart illustrating a method of fabricating a III-nitride HEMT according to an embodiment of the present invention.

FIG. 4 is a simplified flowchart illustrating a method of fabricating a III-nitride HEMT according to an embodiment of the present invention. The method 400 includes providing a substrate including an AlGaN epitaxial layer (410). The epitaxial structure illustrated in FIG. 2A also includes a first n-type III-nitride material substrate, a drift region including a second n-type III-nitride material coupled to the substrate and disposed adjacent to the substrate along a vertical direction, and a p-type III-nitride epitaxial layer coupled to the AlGaN epitaxial layer. The AlGaN epitaxial layer serves as an etch stop during manufacturing of the HEMT as well as a barrier layer of the HEMT. The method also includes forming a masking layer on predetermined portions of the III-nitride epitaxial structure to provide exposed regions (412). As illustrated in FIG. 2B, the exposed regions can define a gate region for the HEMT.

A portion of the III-nitride epitaxial structure above the AlGaN layer is removed using an etching process to form the gate region (414). In the embodiments described herein, the AlGaN layer can serve as an etch stop for a wet etch process utilizing $SF_6$ (or other suitable material that interacts with the aluminum in the layer to decrease the etch rate) or a photo-enhanced chemical etch process using electromagnetic radiation for which the AlGaN layer has low absorption.

The method also includes forming source and drain contacts coupled to the AlGaN layer (416) and forming a metallic structure coupled to the gate region (418). In an embodiment, the metallic structure comprises an ohmic contact coupled to the gate region (e.g., a p-type III-nitride epitaxial material).

It should be appreciated that the specific steps illustrated in FIG. 4 provide a particular method of fabricating a III-nitride HEMT according to an embodiment of the present invention. Other devices can also be fabricated using the methods described in relation to FIG. 4 as well as throughout the present specification. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
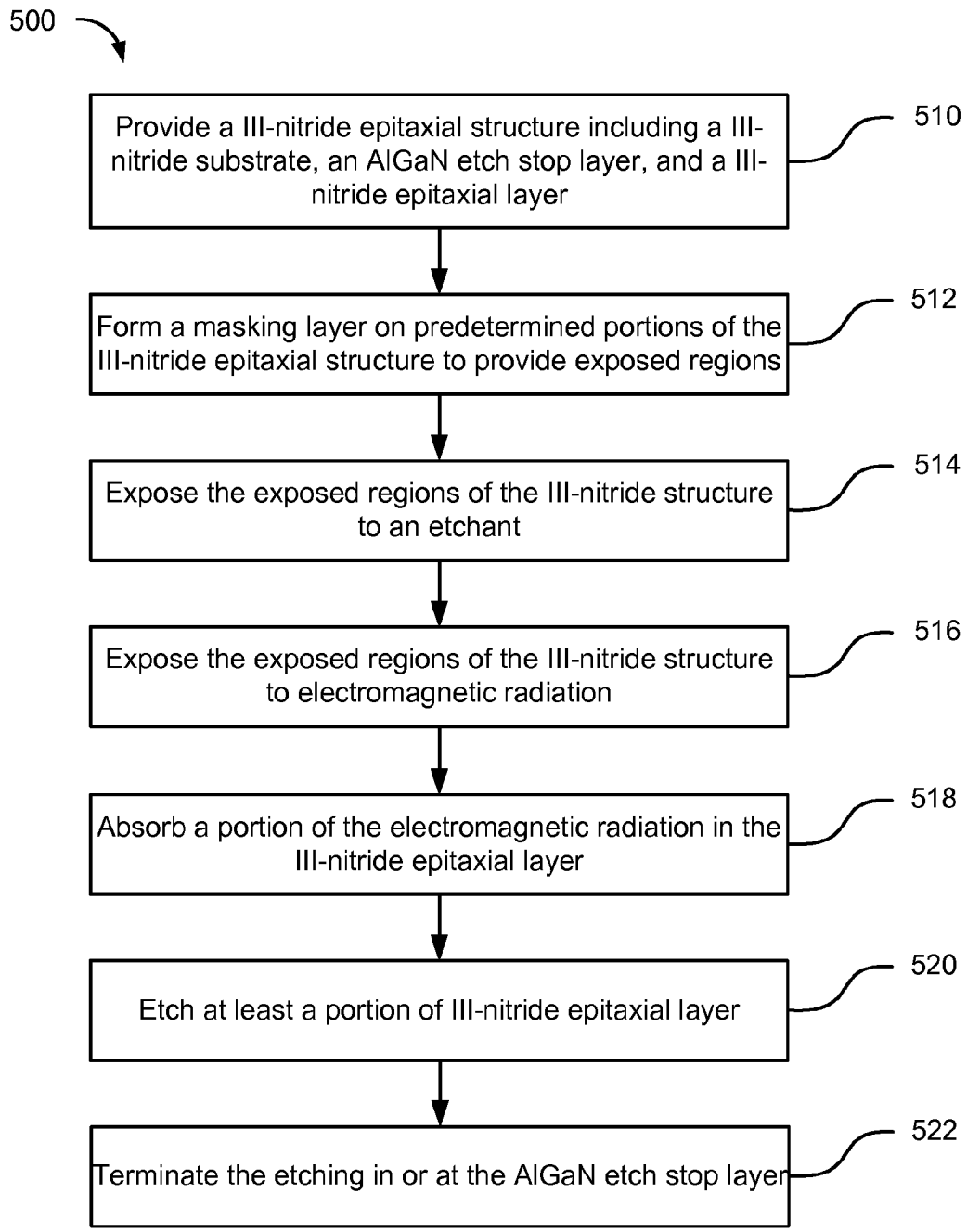
FIG. 5 is a simplified flowchart illustrating a method of processing III-nitride materials according to an embodiment of the present invention.

FIG. 5 is a simplified flowchart illustrating a method of processing III-nitride materials according to an embodiment of the present invention. The method 500 includes providing a III-nitride epitaxial structure including a III-nitride substrate, an AlGaN etch stop layer coupled to the III-nitride substrate, and a III-nitride epitaxial layer coupled to the AlGaN etch stop layer (510). The III-nitride substrate can be an n-type GaN substrate and the AlGaN etch stop layer can be doped or undoped. In some implementations, the III-nitride epitaxial layer is a p-type GaN layer, enabling a p-type layer overlying an n-type layer to be etched, while not etching a substantial portion of the n-type layer. In some embodiments, additional layers are inserted between the layers described above.

The method also includes forming a masking layer on predetermined portions of the III-nitride epitaxial structure to form exposed regions (512), exposing the exposed regions of the III-nitride epitaxial structure to an etchant such as KOH (514), and exposing the III-nitride epitaxial structure to electromagnetic radiation (516).

The method further includes absorbing a portion of the electromagnetic radiation in the III-nitride epitaxial layer (518), etching at least a portion of the III-nitride epitaxial layer (520) and terminating the etching in or at the AlGaN etch stop layer (522). The etching selectivity between the AlGaN layer, which does not substantially absorb the electromagnetic radiation and the GaN layers, which do absorb the electromagnetic radiation, can vary depending on the absorption edge of the AlGaN layer, which is less 365 nm in some embodiments.

It should be appreciated that the specific steps illustrated in FIG. 5 provide a particular method of processing III-nitride materials according to an embodiment of the present invention. Other devices can also be fabricated using the methods described in relation to FIG. 5 as well as throughout the present specification. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor structure comprising:
    a III-nitride substrate having a first side and a second side opposing the first side, wherein the III-nitride substrate is characterized by a first conductivity type and a first dopant concentration;
    a III-nitride epitaxial layer of the first conductivity type coupled to the first surface of the III-nitride substrate;
    a first metallic structure electrically coupled to the second surface of the III-nitride substrate;
    an AlGaN epitaxial layer having a first side coupled to the III-nitride epitaxial layer of the first conductivity type; and
    a III-nitride epitaxial structure of a second conductivity type coupled to the AlGaN epitaxial layer on a second side of the AlGaN epitaxial layer, the second side being opposite the first side, wherein the III-nitride epitaxial structure comprises at least one edge termination structure.

2. The semiconductor structure of claim 1 further comprising a Schottky contact including a second metallic structure coupled to a portion of the AlGaN epitaxial layer.

3. The semiconductor structure of claim 2 wherein the second metallic structure is further coupled to at least a portion of the at least one edge termination structure.

4. The semiconductor structure of claim 2 wherein the AlGaN epitaxial layer is disposed between the second metallic structure and the III-nitride epitaxial layer of the first conductivity type.

5. The semiconductor structure of claim 1 wherein the AlGaN epitaxial layer is characterized by a thickness less than 30 nm.

6. The semiconductor structure of claim 1 wherein the AlGaN epitaxial layer is characterized by a dopant concentration of greater than $1\times10^{17}$ cm$^{-3}$.

7. The semiconductor structure of claim 1 wherein the AlGaN epitaxial layer is characterized by an aluminum mole fraction between 0.01 and 0.50.

8. The semiconductor structure of claim 1 further comprising a metallic field plate coupled to the at least one edge termination structure.

9. The semiconductor structure of claim 1 wherein the at least one edge termination structure circumscribes a semiconductor device.

10. The semiconductor structure of claim 9 wherein the semiconductor device comprises a Schottky barrier diode.

11. The semiconductor structure of claim 1 wherein:
    the at least one edge termination structure comprises three or more edge termination structures with a plurality of spacings between each of the edge termination structures;
    a first spacing is located closer to a semiconductor device than a second spacing; and
    a width of the first spacing is smaller than a width of the second spacing.

* * * * *